United States Patent [19]
Blake et al.

[11] Patent Number: 5,670,217
[45] Date of Patent: Sep. 23, 1997

[54] METHOD FOR CAPTURING AND REMOVING CONTAMINANT PARTICLES FROM AN INTERIOR REGION OF AN ION IMPLANTER

[75] Inventors: Julian G. Blake, Beverly Farms; Robert Becker, Danvers; David Chipman, Lynn; Mary Jones, Beverly; Lyudmila Menn, Marblehead; Frank Sinclair, Quincy; Dale K. Stone, Haverhill, all of Mass.

[73] Assignee: Eaton Corporation, Cleveland, Ohio

[21] Appl. No.: 762,320

[22] Filed: Dec. 9, 1996

Related U.S. Application Data

[62] Division of Ser. No. 574,242, Dec. 18, 1995.

[51] Int. Cl.$^6$ .................................................. B05D 5/12
[52] U.S. Cl. ........................... 427/476; 427/58; 427/181; 427/208.4; 427/237; 427/238; 427/248.1; 427/294; 427/523
[58] Field of Search .................................. 427/476, 523, 427/58, 181, 208.4, 237, 238, 248.1, 294

[56] References Cited

U.S. PATENT DOCUMENTS 4,022,928  5/1977  Piwcyzk ................................. 427/43

FOREIGN PATENT DOCUMENTS 0 140 975  5/1985  European Pat. Off. .
0 648 861  4/1995  European Pat. Off. .

OTHER PUBLICATIONS

Duocel® Aluminum Foam, Energy Research and Generation, Inc., Oakland, California, 2 pages. (no date avail.).

*Primary Examiner*—Bernard Pianalto
*Attorney, Agent, or Firm*—Watts, Hoffmann, Fisher & Heinke, Co., L.P.A.

[57] ABSTRACT

A method of capturing and removing contaminant particles moving within an evacuated interior region of an ion beam implanter is disclosed. The steps of the method include: providing a particle collector having a surface to which contaminant particles readily adhere; securing the particle collector to the implanter such that particle adhering surface is in fluid communication to the contaminant particles moving within the interior region; and removing the particle collector from the implanter after a predetermined period of time. An ion implanter in combination with a particle collector for trapping and removing contaminant particles moving in an evacuated interior region of the implanter traversed by an ion beam is also disclosed, the particle collector including a surface to which the contaminant particles readily adhere and securement means for releasably securing the particle collector to the implanter such that the particle adhering surface is in fluid communication with the evacuated interior region of the implanter.

10 Claims, 3 Drawing Sheets

METHOD FOR CAPTURING AND REMOVING CONTAMINANT PARTICLES FROM AN INTERIOR REGION OF AN ION IMPLANTER

This application is a division of application Ser. No. 08/574,242 filed Dec. 18, 1995.

FIELD OF INVENTION

The present invention concerns a method and an apparatus for capturing and removing contaminant particles moving within an interior region of an ion implanter and, more particularly, capturing contaminant particles by securing a particle collector having a contaminant particle adhering surface in fluid communication with the interior region of the implanter.

BACKGROUND OF THE INVENTION

Ion implanters are used to implant or "dope" silicon wafers with impurities to produce n or p type extrinsic materials. The n and p type extrinsic materials are utilized in the production of semiconductor integrated circuits. As its name implies, the ion implanter dopes the silicon wafers with a selected ion species to produce the desired extrinsic material. Implanting ions generated from source materials such as antimony, arsenic or phosphorus results in n type extrinsic material wafers. If p type extrinsic material wafers are desired, ions generated with source materials such as boron, gallium or indium will be implanted.

The ion implanter includes an ion source for generating positively charged ions from ionizable source materials. The generated ions are formed into a beam and accelerated along a predetermined beam path to an implantation station. The ion implanter includes beam forming and shaping structure extending between the ion source and the implantation station. The beam forming and shaping structure maintains the ion beam and bounds an elongated interior cavity or region through which the beam passes en route to the implantation station. When operating the implanter, the interior region must be evacuated to reduce the probability of ions being deflected from the predetermined beam path as a result of collisions with air molecules.

For high current ion implanters, the wafers at the implantation station are mounted on a surface of a rotating support. As the support rotates, the wafers pass through the ion beam. Ions traveling along the beam path collide with and are implanted in the rotating wafers. A robotic arm withdraws wafers to be treated from a wafer cassette and positions the wafers on the wafer support surface. After treatment, the robotic arm removes the wafers from the wafer support surface and redeposits the treated wafers in the wafer cassette.

Operation of an ion implanter results in the production of certain contaminant particles. One source of contaminant particles is undesirable species of ions generated in the ion source. Contaminant particles with respect to a given implant result from the presence of residual ions from a previous implant in which different ions were implanted. For example, after implanting boron ions in a given number of wafers, it may be desired to change over the implanter to implant arsenic ions. It is likely that some residual boron atoms remain in the interior region of the implanter.

Yet another source of contaminant particles is photoresist material. Photoresist material is coated on wafer surfaces prior to implantation and is required to define circuitry on the completed integrated circuit. As ions strike the wafer surface, particles of photoresist coating are dislodged from the wafer.

Contaminant particles which collide with and adhere to wafers during ion treatment are a major source of yield loss in the fabrication of semiconductor and other devices which require submicroscopic pattern definition on the treated wafers.

In addition to rendering the implanted or treated wafers unsuitable for their intended purpose in the manufacture of integrated circuits, contaminant particles adhering to interior surfaces of the ion implanter reduce the efficiency of ion implanter components, for example, the performance of an ion beam neutralization apparatus will be detrimentally effected by a build-up of photoresist particles on the apparatus' aluminum extension tube.

The vacuum environment of the implanter interior makes capture and removal of contaminant particles problematical. In a vacuum, the motion of submicroscopic particles is extremely difficult to control, particle movement is controlled to a great extent by electrostatic forces. Gravitational forces become insignificant with decreasing particle size.

It has been found that particles moving within the evacuated interior of the implanter bounce or rebound numerous times before settling on and adhering to the workpiece surface or to an interior surface of the implanter. Experience indicates that such a moving particle may bounce 10 to 25 times before settling.

In essence, a particle collector includes a particle adhering surface. Particles colliding with the surface become attached thereto and are removed when the collector is removed. However, for a particle collector to be used in conjunction with an ion implanter, the particle collector would have to be compatible with the vacuum environment. Conventional particle collector surfaces, e.g., adhesives, porous materials, oily materials, etc. tend to outgas in a vacuum environment which makes them inappropriate for use in the implanter. What is needed is a particle collector for contaminant particles which is suitable for use in a vacuum environment and which exhibits high particle adhering qualities.

DISCLOSURE OF THE INVENTION

The present invention provides a method and an apparatus for capturing and removing contaminant particles that move through and land on interior surfaces of an ion implanter. One or more particle collectors have a particle adhering surface positioned within an interior region of an ion implanter. Contaminants that bounce multiple times off the interior walls have a high probability of being captured by the one or more particle adhering surfaces of the particle collectors.

Specifically, the method of the present invention of capturing and removing contaminant particles moving within an interior region of an ion beam implanter includes the steps of: providing a particle collector having a surface to which contaminant particles readily adhere to; securing the particle collector to the implanter such that the particle adhering surface of the collector is in fluid communication with the implanter interior region; and removing the particle collector from the implanter after a predetermined period of time.

An ion implanter in combination with a particle collector for trapping and removing contaminant particles moving in an evacuated interior region of the implanter traversed by an ion beam is also disclosed. The particle collector includes a surface to which the contaminant particles readily adhere and securement means for securing the particle collector to the implanter such that the particle adhering surface is within a clear field of view of regions that tend to generate contaminants within the implanter.

One or more particle collectors may be advantageously positioned at various locations including inside the resolving housing and inside the process chamber. The implanter includes an ion beam resolving housing defining a portion of the interior region traversed by the ion beam. The resolving housing interior region is evacuated. The particle collector may be positioned such that the particle adhering surface is in fluid communication with the portion of the interior region defined by the resolving housing.

The implanter also includes a wafer implantation process chamber defining a portion of the interior region. The particle collector may be positioned such that the particle adhering surface is in fluid communication with the portion of the interior region defined by the process chamber.

The particle adhering surface may additionally attract the contaminant particles. As an example, electret fibers can be used to attract and secure the particles to the particle collector by electrostatic attraction. Alternatively, the particle adhering surface may be coated with partially cured elastomers which secure the particles to the particle collector by surface tension. Silicone elastomer is a preferred elastomer.

These and other objects, advantages and features of the invention will become better understood from a detailed description of a preferred embodiment of the invention which is described in conjunction with the accompanying drawings.

DETAILED DESCRIPTION

Figure 1:
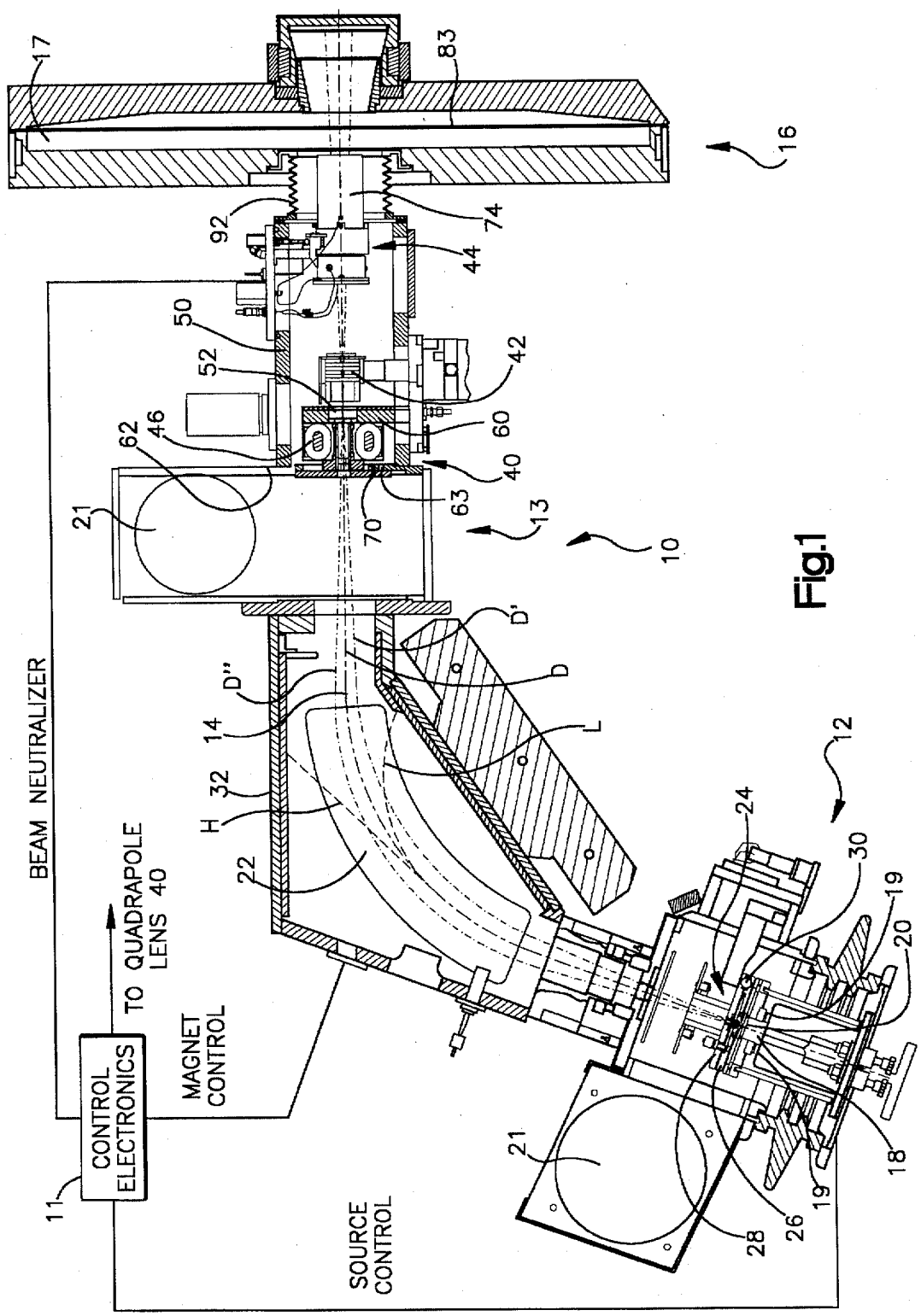
FIG. 1 is a top view, partly in section, showing an ion implanter including an ion source, beam forming and shaping structure and an implantation chamber.

Turning now to the drawings, FIG. 1 depicts an ion implanter, shown generally at 10, which includes an ion source 12 for emitting ions that form an ion beam 14 and an implantation station 16. Control electronics 11 are provided for monitoring and controlling the ion dosage received by the wafers within a process chamber 17 at the implantation station 16. The ion beam 14 traverses the distance between the ion source 12 and the implantation station 16.

The ion source 12 includes a plasma chamber 18 defining an interior region into which source materials are injected. The source materials may include an ionizable gas or vaporized source material. Source material in solid form is deposited into a pair of vaporizers 19. The vaporized source material is then injected into the plasma chamber.

Energy is applied to the source materials to generate positively charged ions in the plasma chamber 18. The positively charged ions exit the plasma chamber interior through an elliptical arc slit in a cover plate 20 overlying an open side of the plasma chamber 18.

An ion source utilizing microwave energy to ionize source materials is disclosed in U.S. patent application Ser. No. 08/312,142, now U.S. Pat. No. 5,523,652 filed Sep. 26, 1994, which is assigned to the assignee of the instant application. U.S. patent application Ser. No. 08/312,142 is incorporated herein in its entirety by reference. The ion beam 14 travels through an evacuated path from the ion source 12 to the implantation station 17, which is also evacuated. Evacuation of the beam path is provided by vacuum pumps 21.

Ions in the plasma chamber 18 are extracted through the arc slit in the plasma chamber cover plate 20 and accelerated toward a mass analyzing magnet 22 by a set of electrodes 24 adjacent the plasma chamber cover plate 20. Ions that make up the ion beam 14 move from the ion source 12 into a magnetic field set up by the mass analyzing magnet 22. The mass analyzing magnet is part of the ion beam forming and shaping structure 13 and is supported within a magnet housing 32. The strength of the magnetic field is controlled by the control electronics 11. The magnet's field is controlled by adjusting a current through the magnet's field windings. The mass analyzing magnet 22 causes the ions traveling along the ion beam 14 to move in a curved trajectory. Only those ions having an appropriate atomic mass reach the ion implantation station 16.

Along the ion beam travel path from the mass analyzing magnet 22 to the implantation station 16, the ion beam 14 is further shaped, evaluated and accelerated due to the potential drop from the high voltage of the mass analyzing magnet housing 32 to the grounded implantation chamber.

The ion beam forming and shaping structure 13 further includes a quadrupole assembly 40, a moveable Faraday cup 42 and an ion beam neutralization apparatus 44. The quadrupole assembly 40 includes set of magnets 46 oriented around the ion beam 14 which are selectively energized by the control electronics (not shown) to adjust the height of the ion beam 14. The quadrupole assembly 40 is supported within a housing 50.

Figure 3:
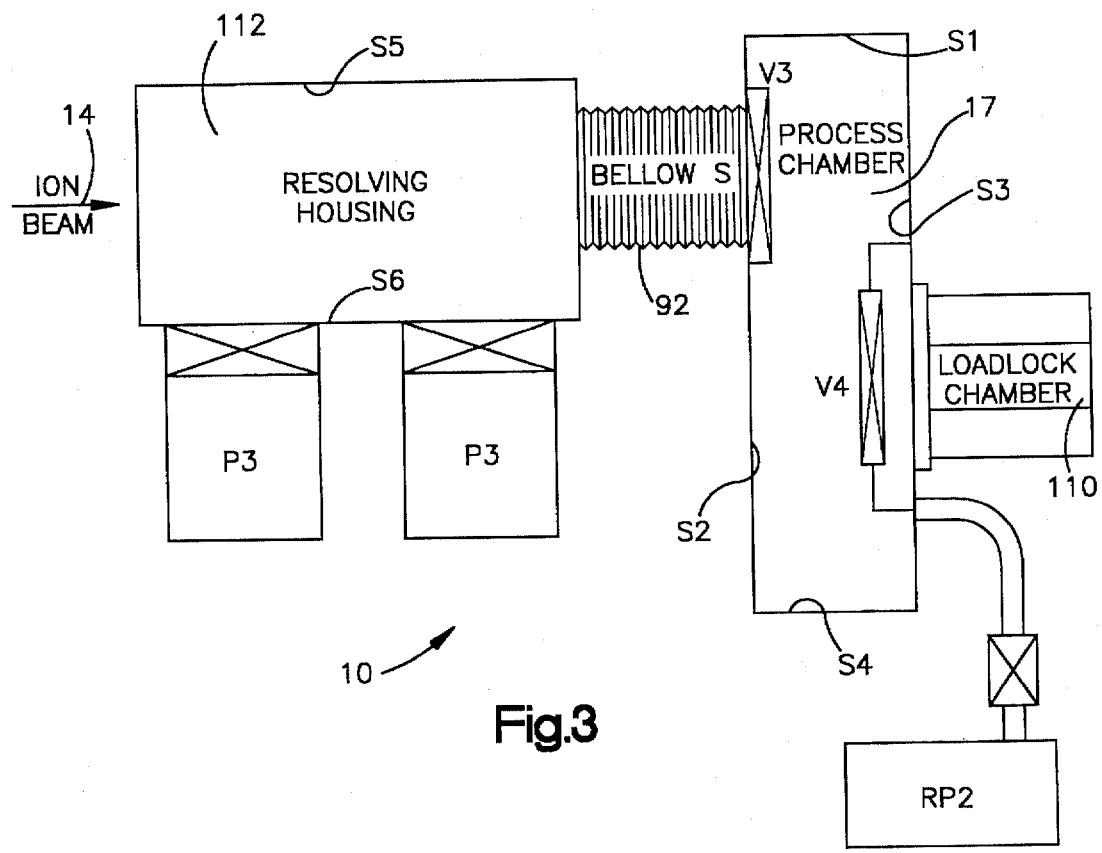
FIG. 3 is a schematic depiction of portions of an ion beam implanter showing portions of the implanter particularly suited for placement of one or more particle collectors for trapping contaminants.

Coupled to an end of the quadrupole assembly 40 facing the Faraday flag 42 is an ion beam resolving plate 52. The resolving plate 52 is comprised of vitreous graphite and is shown in FIG. 3. The resolving plate 52 includes an elongated aperture 56 through which the ions in the ion beam 14 pass as they exit the quadrupole assembly 40. The resolving plate 52 also includes four counterbored holes 58. Screws (not shown) fasten the resolving plate 52 to the quadrupole assembly 40. At the resolving plate 52 the ion beam dispersion, as defined by the width of the envelope D', D", is at its minimum value, that is, the width of D', D" is at a minimum where the ion beam 14 passes through the resolving plate aperture 56.

Figure 2:
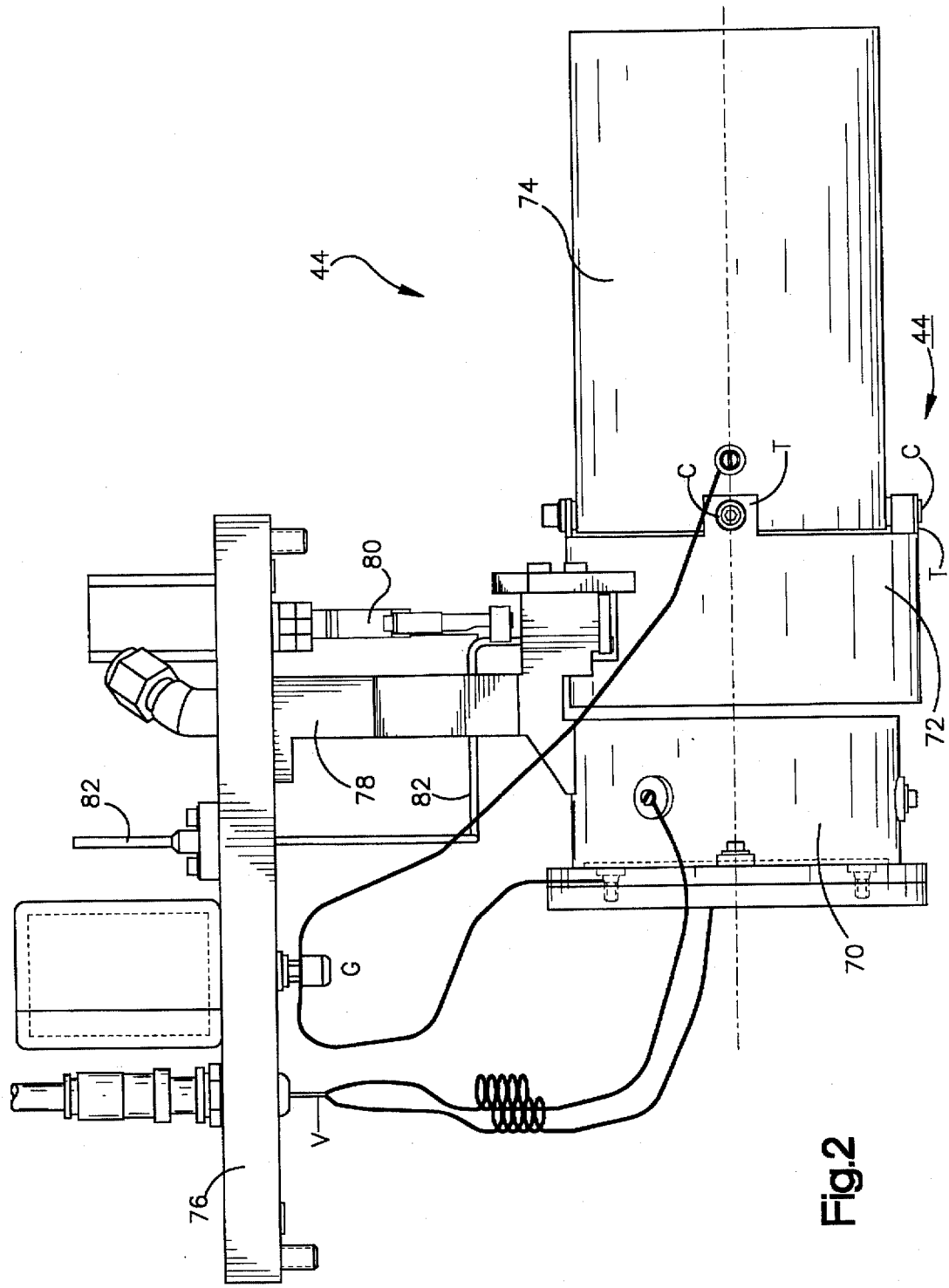
FIG. 2 is an enlarged plan view of an electron shower portion of the ion implanter of FIG. 1.
Figure 4:
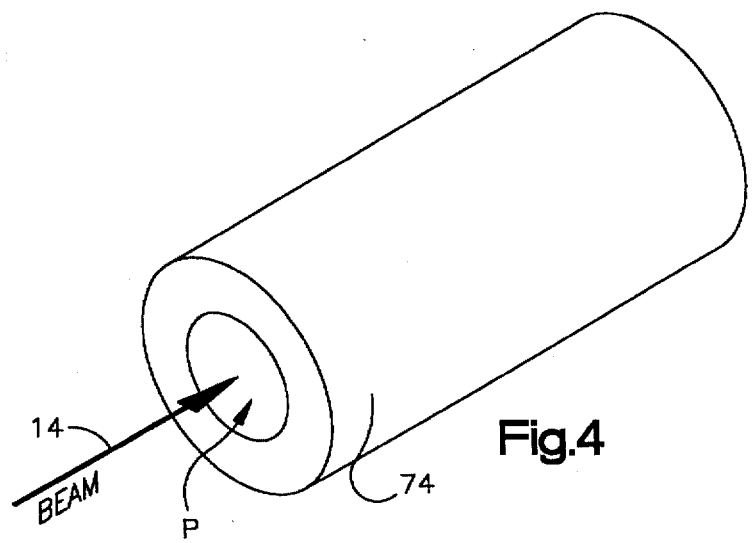
FIG. 4 is a perspective view of an ion neutralization tube that is configured as a particle trap.

The resolving plate 52 functions in conjunction with the mass analyzing magnet 22 to eliminate undesirable ion species from the ion beam 14. The quadrupole assembly 40 is supported by a support bracket 60 and a support plate 62. The support bracket 60 is coupled to an interior surface of the resolving housing 50 while the support plate 62 is coupled to an end of the housing 50 via a plurality of screws (two screws 63 fastening the support plate 62 to the housing 50 is seen in FIG. 2). Attached to the support plate 62 is a quadrupole assembly shield plate 64 (shown in FIG. 4). The quadrupole assembly shield plate 64 is comprised of vitreous graphite and includes a rectangular aperture 66 and four counterbored holes 68. The counterbored holes 68 accept screws which secure the quadrupole assembly shield plate 64 to the support plate 62 (two screws 70 extending through two of the counterbored holes 68 and into the support plate 62 is seen in FIG. 2). The quadrupole assembly shield plate 64 protects the quadrupole assembly 40 from impact by undesirable ions having an atomic mass that is "close" to the atomic mass of the desired ion species. During operation of the implanter 10, undesirable ions impacting an upstream facing surface of the quadrupole assembly shield plate 64 build-up the plate.

As can be seen in FIG. 1, the Faraday flag 42 is located between the quadrupole assembly 40 and the ion beam neutralization apparatus 44. The Faraday flag is moveable relative to the housing 50 so that it can be slid into position to intersect the ion beam 14 to measure beam characteristics and, when the measurements are satisfactory, moved out of the beam line so as to not interfere with wafer implantation at the implantation chamber 17.

The beam forming structure 13 also includes the ion beam neutralization apparatus 44, commonly referred to as an electron shower. U.S. Pat. No. 5,164,599 to Benveniste, issued Nov. 17, 1992, discloses an electron shower apparatus in an ion beam implanter and is incorporated herein in its entirety by reference. The ions extracted from the plasma chamber 18 are positively charged. If the positive charge on the ions is not neutralized at the wafer's surface, the doped wafers will exhibit a net positive charge. As described in the '599 patent, such a net positive charge on a wafer has undesirable characteristics.

The ion beam neutralization apparatus 44 shown in FIG. 2 includes a bias aperture 70, a target 72 and an extension tube 74. Each of the bias aperture 70, the target 72 and the extension tube 74 are hollow and when assembled define an open ended, cylindrical interior region through which the ion beam 14 passes and is neutralized by secondary electron emissions. The neutralizer apparatus 44 is positioned with respect to the housing 50 by a mounting flange 76 which bolts to the resolving housing.

Extending from the mounting flange 76 is a support member 78 and the bias aperture 70. The target is secured to the support member 78. The extension tube 74 is coupled to, but electrically isolated from, the target 72. The extension tube 74 is grounded by a connection with a grounding terminal G. The bias aperture 70 is energized with a negative charge V−. The support member 78 defines an interior passageway (not shown) for the circulation of cooling fluid.

The support member 78 also supports a filament feed 80 electrically coupled to a set of filaments (not shown). The filaments extend into the target 72 and, when energized, emit high energy electrons which are accelerated into an interior region of the target 72. The high energy electrons impact the interior wall of the target 72. The collisions of the high energy electrons with the target interior wall causes an emission of low energy electrons or so-called secondary electron emission.

Particle Traps

A preferred extension tube 74 of the beam neutralizer is constructed from a contaminant capturing material and hence forms a particle trap. More particularly the tube 74 is constructed from a machined cylinder of aluminum foam. A solid cylindrical molded piece is then extracted from the mold and machined to define a throughpassage P having a diameter to accommodate the dimensions of the ion beam that passes through the extension tube 74.

Stray contaminants can become entrapped within the ion beam 14 and carried along with the beam into the beam neutralizer 44. Use of the tube 74 tends to collect any such contaminating particles that are within the beam and which have travel paths along the beam border. They can collide with the tube 74 and are not only removed from the beam and hence do not bombard the target within the implantation chamber, but they do not bounce off the surface of the tube 74 due do to the makeup of the tube.

The tube 74 is constructed from the foam aluminum material and has a high surface area. An inner surface that bounds the throughpassage P tends to reduce bouncing of stray contamination particles off the walls of the throughpassage. The tube's inner surface has many irregularities, pockets, depressions and crevices. The aluminum forms a lattice structure of connected segments interspaced by irregularly organized voids into which the stray contaminants can center and become trapped.

The preferred aluminum foam is sold under the designation Duoeel (Registered Trademark) by Energy Research and Generation, Inc. of Oakland, Calif. The material has been used in the prior art as a construction material where high mechanical strength is required but where lightweight construction materials are necessary.

Implantation Chamber 17

The implantation station 16 includes the evacuated implantation chamber 17 (FIGS. 1 and 3). Rotatably supported within the implantation chamber 17 is a disk shaped wafer support (not shown). Wafers to be treated are positioned near a peripheral edge of the wafer support and the support is rotated by a motor (not shown) at about 1200 RPM. The ion beam 14 impinges on the wafers and treats the wafers as they rotate in a circular path.

The implantation station 16 is pivotable with respect to the housing 50 and is connected thereto by a flexible bellows 92. The ability to pivot the implantation station 16 permits adjustments to the angle of incidence of the ion beam 14 on the wafer implantation surface.

FIG. 3 schematically indicates components of the ion implanter 10 to which material constructed from the foam aluminum could conveniently be attached. These other particle collectors could supplement or be used in place of the tube 74 shown in FIG. 4. Instead of supported by the existing beam neutralizer apparatus, such additional collectors having surfaces S1-S6 would be constructed from generally planar sheets of aluminum foam that have a thickness of 0.25 inches and whose outer dimensions vary depending on their intended position within the implanter.

Tradeoffs are involved in the choice of material density for use in the particle trap. More accurately, the pore density of the aluminum foam has been analyzed to determine optimum material characteristics. The aluminum foam material is available in a variety of pore densities ranging from about 10 pores per inch to about 40 pores per inch. (Note, the description of foam porosity in units of pores per inch originates with Energy Research and Generation, Inc.) In choosing the correct materials two principle issues are considered.

A first issue is particle trap efficiency. A suitable thickness for the foam is controlled to a degree by mechanical constraints such as the clearance needed between the rotating disk that supports the wafers and the process chamber walls. Once the preferred thickness of 0.25 inch is specified, the foams porosity must be chosen.

The porosity must be chosen so that particles have a negligible probability of bouncing off from the foam. The foam needs to be porous enough to allow use of most of the interior surface area of the foam material to assure the particle trapping efficiency is as high as possible. A foam which is too porous will not work because particles would simply pass through it, bounce off the walls of the ion implanter and again pass through the foam. A foam with too little porosity would reflect many particles from its front surface.

A second issue is controlled by the mechanical strength and ease in fabrication of the foam. In general coarser foams (10 pores per inch) are harder to fabricate, especially in the geometry of particle traps used with ion implanters.

These two issues cause a pore density of about 20 pores per inch to be chosen for the 0.25 inch thick foam. This results in a foam density of 6 to 8 percent of the bulk aluminum by weight. Another criterion for both the sheets and the tube 74 is that it must be able to be periodically replaced so that as contaminants build up they can be removed from the ion implanter. The tube 74 is attached to the beam neutralizer 44 by means of connectors C that extend through four equally spaced mounting tabs T integrally formed with the target 72.

The process chamber 17 of FIG. 3 is seen to include two vacuum ports V3, V4 for controllably pressurizing and depressurizing the process chamber 17 when maintenance is performed on the implanter. Wafers are inserted into the chamber 17 by means of a load lock 110 and mounted onto a rotating support that carries the wafers through the ion beam. Photoresist on the wafers tends to be ejected off from the wafers and can collect on the interior surfaces S1, S2, S3, S4 of collector sheets mounted within the process chamber.

Mounting of the sheets within the process chamber or along surfaces S5, S6 within the resolving housing 112 is accomplished with a special adhesive. In accordance with the invention, a room temperature cured vulcanized silicone adhesive (RTV) is applied to the interior surface of the ion implanter and the aluminum foam sheet is applied to the treated surface. This process has been found to adequately secure the sheet within the implanter without producing further contaminants inside the process chamber 17 or the resolving housing 112.

While the present invention has been described in some degree of particularity, it is to be understood that those of ordinary skill in the art may make certain additions or modifications to, or deletions from, the described present embodiment of the invention without departing from the spirit or scope of the invention, as set forth in the appended claims.

We claim:

1. A method of capturing and removing contaminant particles moving within an evacuated interior region of an ion implanter wherein charged ions traverse an ion travel path in the evacuated interior region to treat a workpiece, the steps of the method comprising:

a) providing a particle collector having a particle adhering surface to which contaminant particles adhere;

b) securing the particle collector to the implanter such that the particle adhering surface of the collector is positioned within the evacuated interior region at a location near the ion travel path; and c) removing the particle collector from the ion beam implanter at periodic time intervals to remove particles adhering to the collector from the evacuated interior region of the implanter.

2. The method of capturing and removing contaminant particles as set forth in claim 1 wherein the particle collector is attached to a surface of the implanter bounding the interior region.

3. The method of capturing and removing contaminant particles as set forth in claim 1 wherein the particle adhering surface of the collector additionally attracts the contaminant particles.

4. The method of capturing and removing contaminant particles as set forth in claim 3 wherein the particle adhering and attracting surface is comprised of electret fibers which attract and secure the contaminant particles to the particle collector by electrostatic attraction.

5. The method of capturing and removing contaminant particles as set forth in claim 1 wherein the securing step includes a step of coating an attachment surface with a partially cured elastomer which secures the particle collector to an inner wall of the ion implanter.

6. The method of capturing and removing contaminant particles as set forth in claim 5 wherein the coating of partially cured elastomers includes the step of partially curing a silicone elastomer.

7. The method of capturing and removing contaminant particles as set forth in claim 1 wherein the particle adhering surface of the particle collector is positioned inside a process chamber of the implanter that contains one or more workpieces.

8. The method of capturing and removing contaminant particles as set forth in claim 7 wherein the particle collector is attached to an interior surface of the process chamber facing a treatment surface of the workpiece.

9. The method of capturing and removing contaminant particles as set forth in claim 1 wherein the particle collector particle adhering surface is within a clear field of view of a resolving housing of the implanter.

10. The method of capturing and removing contaminant particles as set forth in claim 9 wherein the particle collector is attached to an interior surface of the resolving housing.

* * * * *